(12) United States Patent
Ouchi (10) Patent No.: US 8,421,504 B2
(45) Date of Patent: Apr. 16, 2013

(54) MICROCOMPUTER, HYSTERESIS COMPARATOR CIRCUIT, AND VOLTAGE MONITORING APPARATUS

(75) Inventor: Masahide Ouchi, Kanagawa (JP)

(73) Assignee: Renesas Electronics Corporation, Kawasaki, Kanagawa (JP)

( * ) Notice: Subject to any disclaimer, the term of this patent is extended or adjusted under 35 U.S.C. 154(b) by 193 days.

(21) Appl. No.: 12/926,176

(22) Filed: Oct. 29, 2010

(65) Prior Publication Data

US 2011/0115526 A1 May 19, 2011

(30) Foreign Application Priority Data

Nov. 18, 2009 (JP) ................................. 2009-262548

(51) Int. Cl.
*H03L 7/00* (2006.01)
(52) U.S. Cl.
USPC ............... 327/74; 327/143; 327/58; 327/250; 327/198
(58) Field of Classification Search .................. 327/143, 327/74, 58, 250, 198; 713/340, 324
See application file for complete search history.

(56) References Cited

U.S. PATENT DOCUMENTS

| | | | | |
|---|---|---|---|---|
| 5,619,156 A * | 4/1997 | Jandu | ............................. | 327/198 |
| 5,689,460 A * | 11/1997 | Ooishi | ..................... | 365/189.07 |
| 5,712,581 A * | 1/1998 | Kaylor | ............................. | 327/74 |
| 7,215,158 B2 * | 5/2007 | Kitagawa et al. | ................ | 327/63 |
| 7,525,349 B2 * | 4/2009 | Mavoori et al. | .................. | 327/74 |
| 7,724,040 B2 * | 5/2010 | Zou et al. | .......................... | 327/74 |
| 8,063,667 B2 * | 11/2011 | Tomita | ............................. | 327/58 |
| 2005/0033998 A1 * | 2/2005 | Honda et al. | ................... | 713/300 |
| 2006/0119401 A1 * | 6/2006 | Kitagawa et al. | ................ | 327/74 |
| 2007/0069768 A1 * | 3/2007 | Hatooka et al. | .................. | 327/74 |
| 2009/0322379 A1 * | 12/2009 | Tomita | ............................. | 327/58 |
| 2010/0014331 A1 * | 1/2010 | Moon et al. | ...................... | 363/89 |
| 2011/0018587 A1 * | 1/2011 | Li | ..................................... | 327/74 |
| 2011/0080207 A1 * | 4/2011 | Ball | ............................. | 327/512 |
| 2011/0115526 A1 * | 5/2011 | Ouchi | ............................. | 327/74 |
| 2011/0204925 A1 * | 8/2011 | Barrenscheen et al. | ......... | 327/74 |
| 2012/0126856 A1 * | 5/2012 | Lee et al. | .......................... | 327/74 |
| 2012/0161728 A1 * | 6/2012 | Chen et al. | ..................... | 323/271 |

FOREIGN PATENT DOCUMENTS

| | | |
|---|---|---|
| JP | 2001-285038 | 10/2001 |
| JP | 2005-71320 | 3/2005 |
| JP | 2006-109013 | 4/2006 |

* cited by examiner

*Primary Examiner* — Adam Houston
(74) *Attorney, Agent, or Firm* — McGinn IP Law Group, PLLC (57) ABSTRACT

A microcomputer includes a first comparator which compares a voltage to be monitored, with a first reference voltage, a second comparator which compares the voltage to be compared, with a second reference voltage, and an interrupt control circuit which monitors the voltage to be monitored by the first and second comparators in parallel and, when a preset condition is satisfied, generates an interrupt signal.

12 Claims, 10 Drawing Sheets

MICROCOMPUTER, HYSTERESIS COMPARATOR CIRCUIT, AND VOLTAGE MONITORING APPARATUS

CROSS-REFERENCE TO RELATED APPLICATIONS

The disclosure of Japanese Patent Application No. 2009-262548 filed on Nov. 18, 2009 including the specification, drawings and abstract is incorporated herein by reference in its entirety.

BACKGROUND OF THE INVENTION

1. Field of the Invention

The present invention relates to a microcomputer having a function of monitoring a voltage, a hysteresis comparator circuit, and a voltage monitoring apparatus. More particularly, the invention relates to a microcomputer having a comparator for comparing a voltage to be monitored with a reference voltage, a hysteresis comparator circuit which can be mounted on the microcomputer, and a voltage monitoring apparatus for monitoring a voltage to be monitored.

2. Description of Related Art

In the field of vehicles and the like, there is a case that a microcomputer having a voltage comparator is used for monitoring a voltage of a battery or the like. For example, FIG. 7 of Japanese Unexamined Patent Application Publication No. 2005-71320 (patent document 1) shows a semiconductor integrated circuit device 51 including a microcomputer 55 which uses a comparator 67 for monitoring a power source voltage in an electric control unit of a vehicle. FIG. 9 of the patent document 1 shows that a comparator 73 is provided with a hysteresis characteristic.

Japanese Unexamined Patent Application Publication No. 2006-109013 (patent document 2) discloses an electronic control unit of a vehicle, having a comparator for a standby mode and a comparator for a normal mode, the comparators being coupled to same communication data (CAN), wherein a comparator switching circuit is provided which supplies different threshold voltages (reference voltages) to the two comparators and prevents a signal in an indeterminate level from being outputted at the time of mode switching between the standby mode and the normal mode.

Japanese Unexamined Patent Application Publication No. 2001-285038 (patent document 3) discloses a window comparator for determining whether input voltage lies in a predetermined voltage range or not.

SUMMARY

Figure 1:
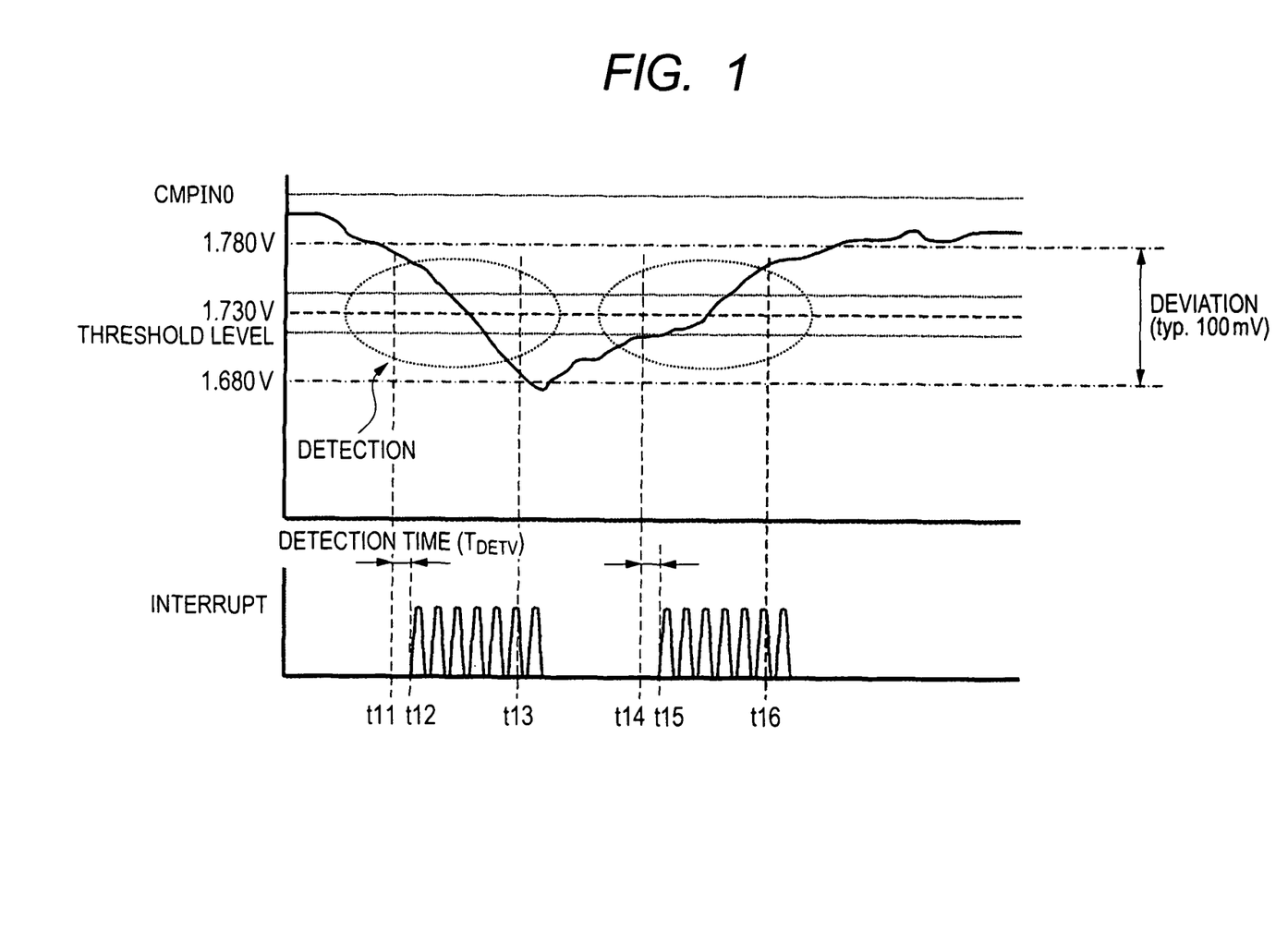
FIG. 1 is a diagram for explaining a problem in a conventional microcomputer.

The following analysis is given by the present invention. In the case of monitoring occurrence of an event requiring a real-time process in a microcomputer, it is efficient to generate an interrupt signal in response to the event and execute a process accompanying the event. Also in the case where the event is fluctuations in a voltage in a battery or the like, it is preferable to monitor the voltage by a comparator and generate an interruption when something abnormal occurs in the voltage. However, as shown in FIG. 1, when a voltage to be monitored becomes close to a threshold voltage of a comparator, there is the possibility that an interrupt occurs again and again due to fluctuations in the noise caused by noises or the like. Even if the comparator is provided with the hysteresis characteristic, when the single comparator is used, the upper-limit value and the lower-limit value of the threshold cannot be set to proper voltages.

Further, there is also a case that a change in a voltage to be monitored has to be determined on the basis of a plurality of voltages as references at the same time such as a case where it is necessary to monitor, except for the hysteresis characteristic, a gentle change and a sharp change in voltage, and a change of the voltage to become a voltage between the upper-limit value and the lower-limit value.

The present invention seeks to solve one or more of the above problems, or to improve upon those problems at least in part.

A microcomputer according to a first aspect of the present invention includes a first comparator which compares a voltage to be monitored, with a first reference voltage, a second comparator which compares the voltage to be compared, with a second reference voltage, and an interrupt control circuit which monitors the voltage to be monitored by the first and second comparators in parallel and, when a preset condition is satisfied, generates an interrupt signal.

A hysteresis comparator circuit according to a second aspect of the present invention includes a first comparator which compares a voltage to be monitored with a first reference voltage, a second comparator which compares the voltage to be compared, with a second reference voltage, a first D/A converter which sets the first reference voltage, a second D/A converter which sets the second reference voltage, and a flip-flop circuit which is set according to a comparison result of one of the first and second comparators and is reset according to a comparison result of the other comparator.

A voltage monitoring apparatus according to a third aspect of the present invention includes a first comparator which compares a voltage to be monitored with a first reference voltage, a second comparator which compares the voltage to be compared, with a second reference voltage, a first reference voltage setting register which stores a set value of the first reference voltage, a second reference voltage setting register which stores a set value of the second reference voltage, a first D/A converter which outputs the first reference voltage on the basis of a set value in the first reference voltage setting register, a second D/A converter which outputs the second reference voltage on the basis of a set value in the second reference voltage setting register, and a spare voltage setting register which stores a set value of a third reference voltage. A value in the first reference voltage setting register is automatically updated with a value of the spare voltage setting register when the first comparator detects that the voltage to be monitored drops below the first reference voltage. The first reference voltage, the second reference voltage, and the third reference voltage in descending order are preliminarily set in the first reference voltage setting register, the second reference voltage setting register, and the spare voltage setting register, respectively. A gentle drop from the voltage to be monitored to a voltage equal to or less than the first reference voltage and a sharp drop to a voltage equal to or less than the second reference voltage are simultaneously monitored, and after the voltage to be monitored drops to a voltage equal to or less than the first reference voltage, a gentle drop from the voltage to be monitored to a voltage equal to or less than the second reference voltage and a sharp drop to a voltage equal to or less than the third reference voltage are simultaneously monitored.

According to the invention, comparison between a voltage to be monitored and the first reference voltage by the first comparator and comparison between the voltage to be monitored and the second reference voltage by the second comparator are performed in parallel. When a preset condition is satisfied, an interrupt signal is generated. Consequently, a microcomputer capable of promptly executing a process based on the voltage to be monitored when the process becomes necessary can be obtained.

By providing the flip-flop circuit which is set by a comparison result of one of the first and second comparators and is reset by a comparison result of the other comparator, a hysteresis comparator circuit using a first reference voltage and a second reference voltage has a hysteresis is obtained.

Further, the voltage monitoring apparatus capable of simultaneously monitoring a gentle voltage drop to a voltage equal to or less than a reference voltage as the first reference voltage of the voltage to be monitored and a sharp voltage drop to the second reference voltage lower than the first reference voltage can be obtained.

BRIEF DESCRIPTION OF THE DRAWINGS

The above and other purposes, advantages and features of the present invention will become more apparent from the following description of certain exemplary embodiments taken in conjunction with the accompanying drawings in which.

DETAILED DESCRIPTION OF THE EXEMPLARY EMBODIMENTS

Prior to detailed description of exemplary embodiments of the present invention, outline of exemplary embodiments of the invention will be described. Drawings and reference numerals in the drawings cited in the description of the outline are shown as an example of exemplary embodiments and do not regulate variations of exemplary embodiments of the invention.

Microcomputers 100, 100A, 100B, 100C, and 100D as exemplary embodiments of the invention have, as shown in FIGS. 3, 5, 7, 8, and 9, a first comparator 201 which compares a voltage CMPIN0 to be monitored with a first reference voltage VR0, a second comparator 202 which compares the voltage CMPIN0 to be compared with a second reference voltage VR1, and interrupt control circuits 211, 211A, 211B, and 211D which monitors the voltage CMPIN0 to be monitored in parallel with the first and second comparators 201 and 202 and, when a preset condition is satisfied, generates an interrupt signal INTCMP0.

Preferably, the microcomputer further includes a first D/A converter (225, 223, and a part of 224) which sets the first reference voltage VR0 and a second D/A converter (226, 223, and the rest of 224, 223 being also used as the first D/A converter) which sets the second reference voltage VR1.

Preferably, as illustrated in FIGS. 3, 7, 8, and 9, there is provided a flip-flop circuit 212, which is set according to a comparison result of one of the first and second comparators and is reset according to a comparison result of the other comparator. A first mode of generating the interrupt signal INTCMP0 by the edge of an output signal of the flip-flop circuit 212 is provided.

Figure 10:
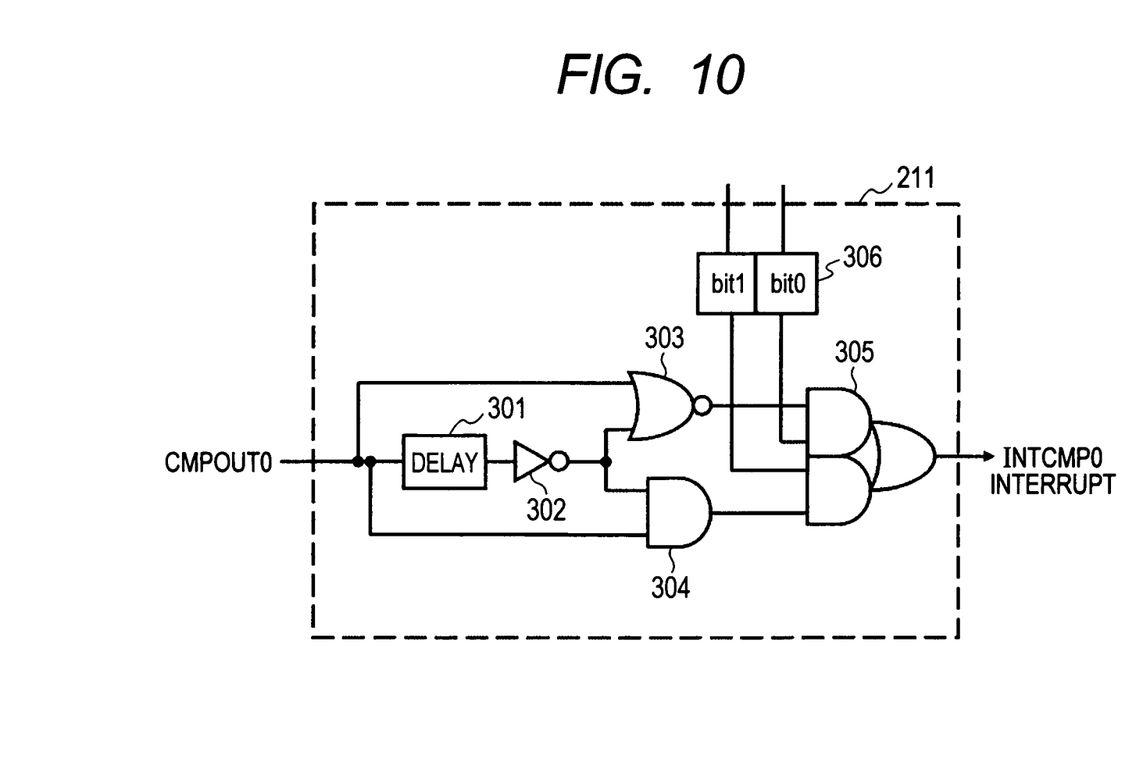
FIG. 10 is a circuit block diagram showing a configuration example of an interrupt control circuit in the first exemplary embodiment.

As in a configuration example of an interrupt control circuit shown in FIG. 10, preferably, interruption in the first mode is inhibited, or a condition of generating the interrupt signal INTCMP0 at a rising edge and/or a trailing edge can be set.

Preferably, as illustrated in FIGS. 5, 7, 8, and 9, a second mode of generating the interrupt signal INTCMP0 when either a first interrupt generating condition according to a comparison result of the first comparator or a second interrupt generating condition according to a comparison result of the second comparator is satisfied.

Preferably, a register (for example, I0 to I3 in Table 1) capable of setting whether interruption by the first and second comparators in the second mode is inhibited or not or whether the interrupt signal INTCMP0 is generated in the case where a comparison result of the first and second comparators is large or small.

Preferably, as shown in FIGS. 5, 7, 8, and 9, the microcomputer further includes a first reference voltage setting register 227 which sets the first reference voltage VR0, a second reference voltage setting register 228 which sets the second reference voltage VR1, and a spare voltage setting register 242 or 243 which is provided in correspondence with at least one of the first and second comparators. When the comparator generates the interrupt signal INTCMP0 in the second mode, the spare voltage setting registers 242 and 243 update values of reference voltage setting registers (227 and 228) of the comparator with values of the spare voltage setting registers (242 and 243).

Figure 8:
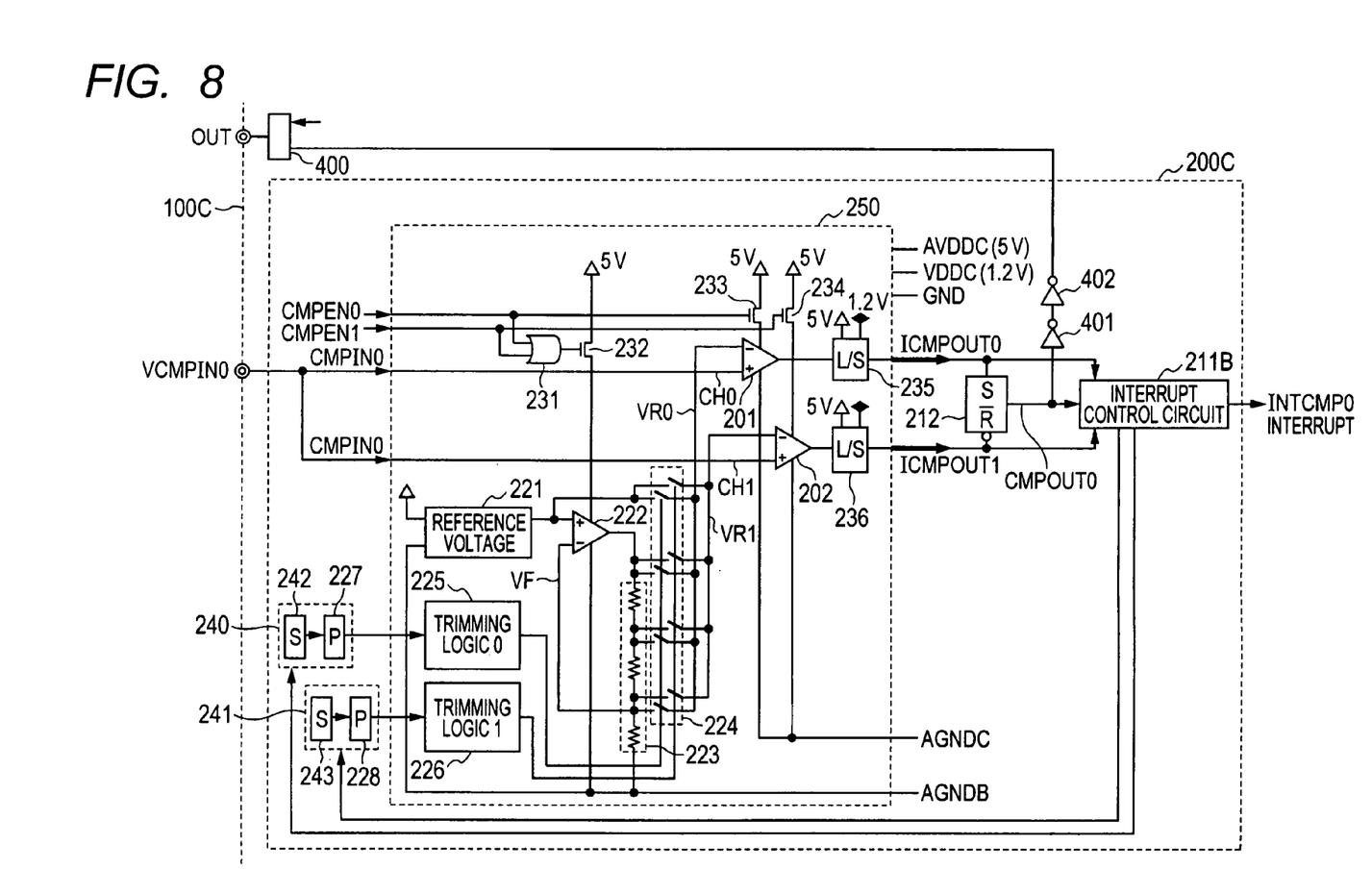
FIG. 8 is a circuit block diagram of a voltage monitoring unit in a microcomputer in a fourth exemplary embodiment.

As shown in an example of FIG. 8, preferably, an output signal of the flip-flop circuit 212 can be set in an external terminal OUT.

Figure 9:
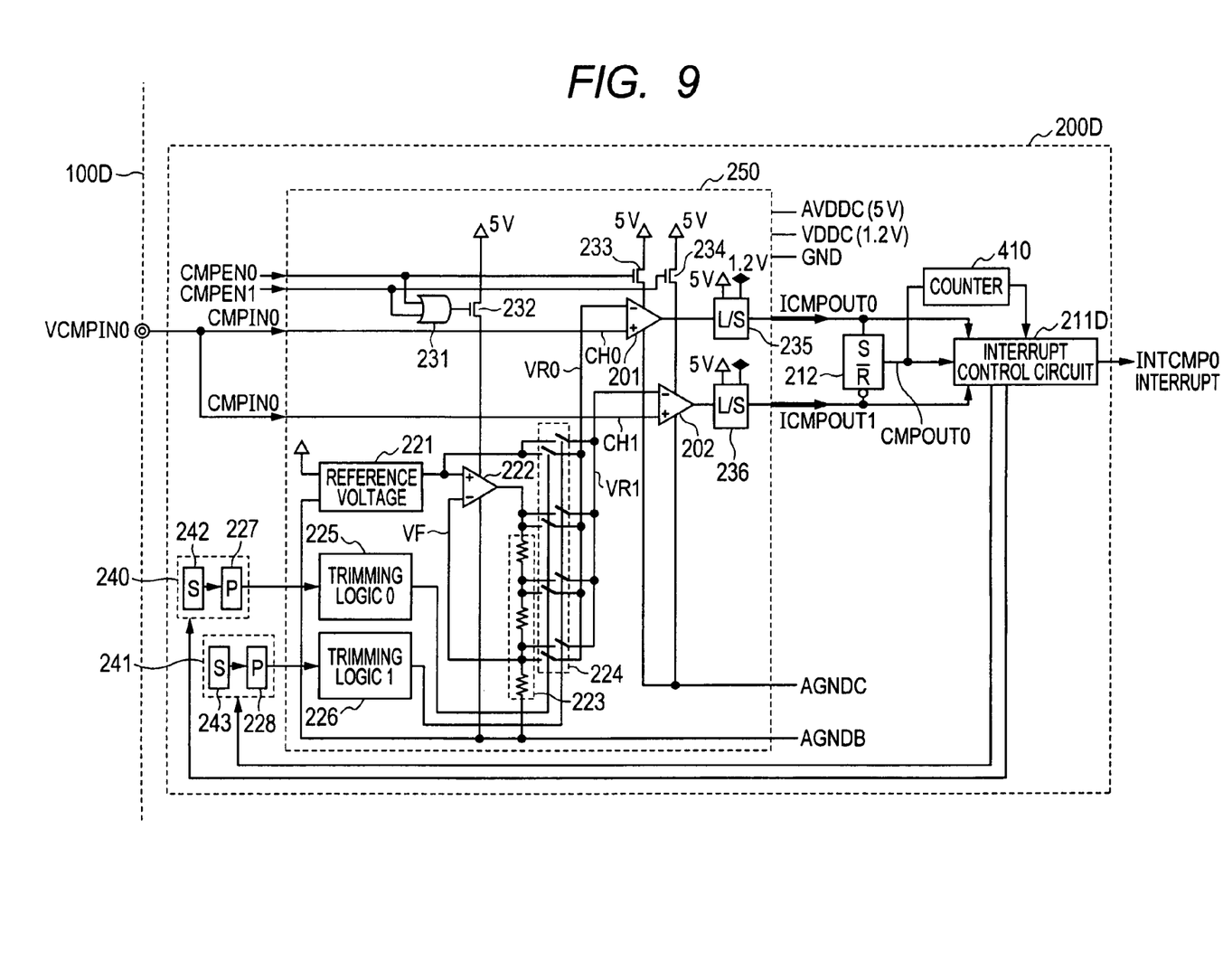
FIG. 9 is a circuit block diagram of a voltage monitoring unit in a microcomputer in a fifth exemplary embodiment.

As shown in an example of FIG. 9, preferably, the microcomputer further includes a counter circuit 410 which counts an output signal of the flip-flop circuit 212. When a counter value of the counter circuit 410 reaches a predetermined value, the interrupt signal is generated.

Preferably, the microcomputer further includes a third mode of generating no interrupt signal when either a first interrupt generating condition according to a comparison result of the first comparator or a second interrupt generating condition according to a comparison result of the second comparator is satisfied and generating the interrupt signal when the first and second interrupt generating conditions are satisfied simultaneously. For example, in FIGS. 5, 7, 8, and 9, the interrupt control circuits 211A, 211B, and 211D may generate an interrupt signal when an interrupt generating condition of a comparator CH0 according to ICMPOUT0 and an interrupt generating condition of a comparator CH1 according to ICMPOUT1 are satisfied. For example, the comparators can be used as a window comparator that generates an interrupt signal only in the case where a voltage CMPIN0 becomes an intermediate voltage between the voltages VR0 and VR1.

Preferably, in the second mode, in the case where the first and second interrupt generating conditions are satisfied simultaneously, priority is placed on an interruption generated when one of the interrupt generating conditions is satisfied over an interruption generated when the other interrupt generating condition is satisfied. For example, in the case of detecting a gentle drop in the power source voltage under a first interrupt generating condition and detecting a sharp drop in the power source voltage under a second interrupt generating condition, it is preferable to give priority on an interrupting process performed in response to detection of the sharp drop in the power source voltage over a interrupting process performed in response to detection of the gentle drop in the power source voltage. It is also preferable to further provide an input terminal VCMPIN0 of the voltage to be monitored.

Figure 3:
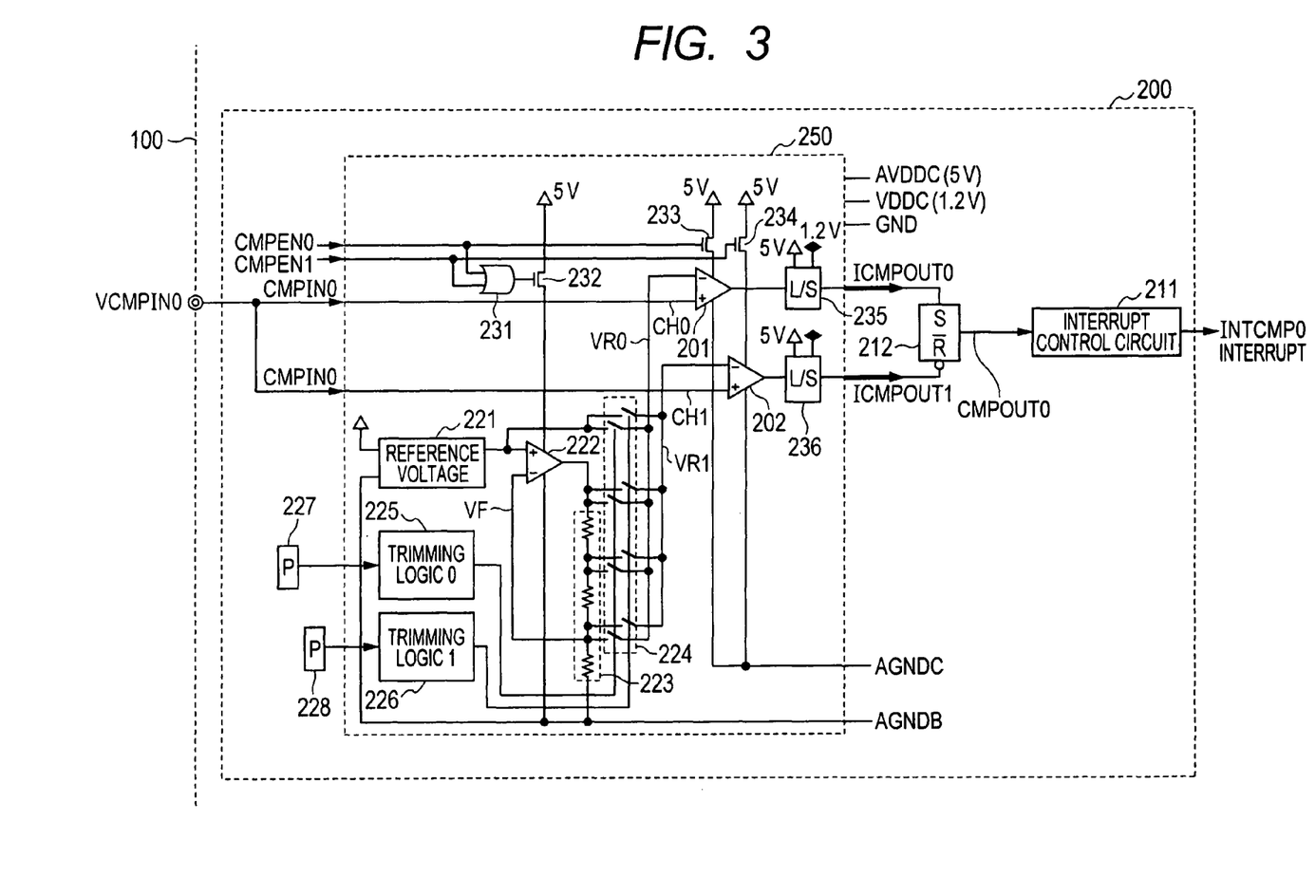
FIG. 3 is a circuit block diagram of a voltage monitoring unit of a microcomputer in a first exemplary embodiment of the invention.

Further, as shown in an example of FIG. 3, a hysteresis comparator circuit (250 and 212) as an exemplary embodiment of the invention includes a first comparator 201 which compares a voltage CMPIN0 to be monitored with a first reference voltage VR0, a second comparator 202 which compares the voltage CMPIN0 to be compared, with a second reference voltage VR1, a first D/A converter (225, 223, and a part of 224) which sets the first reference voltage, a second D/A converter (226, 223, and the rest of 224, 223 being commonly used by the first D/A converter) which sets the second reference voltage, and a flip-flop circuit 212 which is set according to a comparison result of one of the first and second comparators and is reset according to a comparison result of the other comparator.

Figure 5:
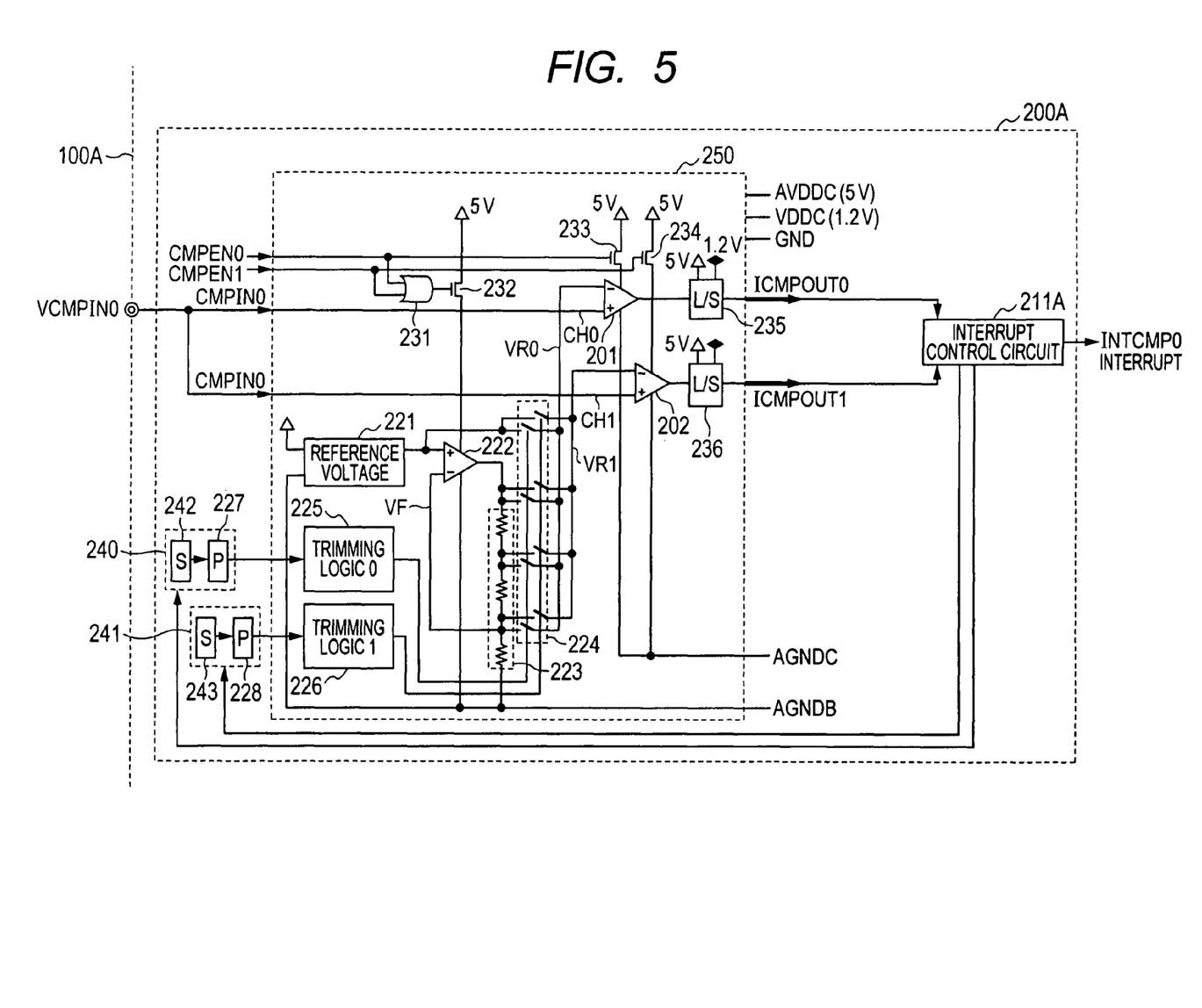
FIG. 5 is a circuit block diagram of a voltage monitoring unit in a microcomputer in a second exemplary embodiment.
Figure 6:
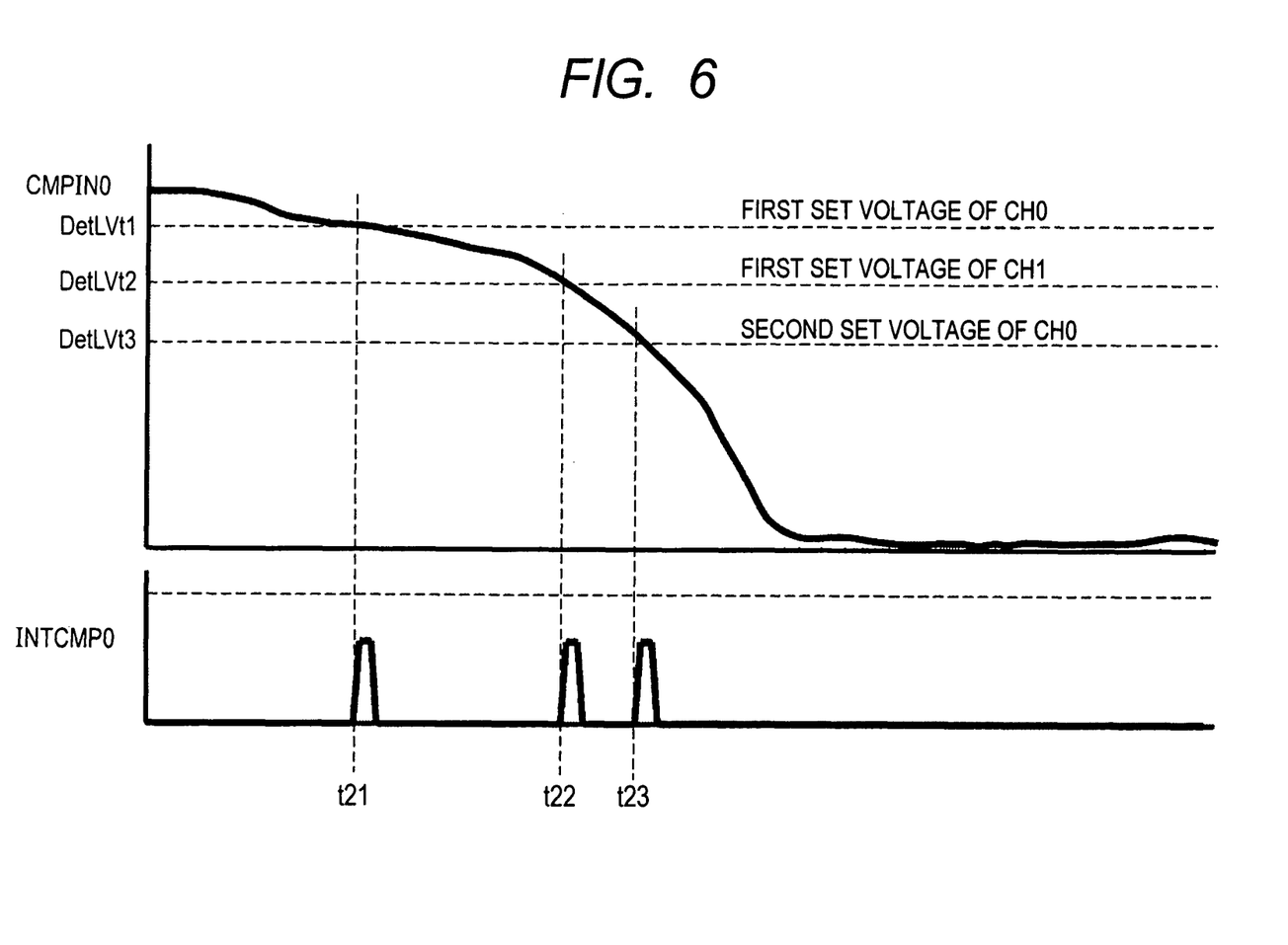
FIG. 6 is an operation waveform chart of the voltage monitoring unit in the second exemplary embodiment.

As an example of the configuration is shown in FIG. 5 and an example of operation is shown in FIG. 6, a voltage monitoring apparatus as an exemplary embodiment of the invention includes a first comparator 201 which compares a voltage CMPIN0 to be monitored with a first reference voltage VR0, a second comparator 202 which compares the voltage CMPIN0 to be compared, with a second reference voltage VR1, a first reference voltage setting register 227 which stores a set value of the first reference voltage; a second reference voltage setting register 228 which stores a set value of the second reference voltage, a first D/A converter (225, 223, and a part of 224) which outputs the first reference voltage on the basis of a set value in the first reference voltage setting register 227, a second D/A converter (226, 223, and the rest of 224, 223 being commonly used by the first D/A converter) which outputs the second reference voltage on the basis of a set value in the second reference voltage setting register 228, and a spare voltage setting register (242 and 243) which stores a set value of a third reference voltage. A value in the first reference voltage setting register 227 is automatically updated with a value of the spare voltage setting register 242 when the first comparator 201 detects that the voltage CMPIN0 to be monitored drops below the first reference voltage VR0. The first reference voltage DetLVt1, the second reference voltage DetLVt2, and the third reference voltage DetLVt3 in descending order are preliminarily set in the first reference voltage setting register 227, the second reference voltage setting register 228, and the spare voltage setting register 242, respectively. A gentle drop from the voltage CMPIN0 to be monitored to a voltage equal to or less than the first reference voltage DetLVt1 (VR0) and a sharp drop to a voltage equal to or less than the second reference voltage DetLVt2 (VR1) are simultaneously monitored. After the voltage CMPIN0 to be monitored drops to a voltage equal to or less than the first reference voltage DetLVt1 (VR0), a gentle drop from the voltage CMPIN0 to be monitored to a voltage equal to or less than the second reference voltage DetLVt2 (VR1) and a sharp drop to a voltage equal to or less than the third reference voltage DetLVt3 (VR0) are simultaneously monitored.

More concrete description of exemplary embodiments of the present invention will be described in detail below with reference to the drawings.

First Exemplary Embodiment

Figure 2:
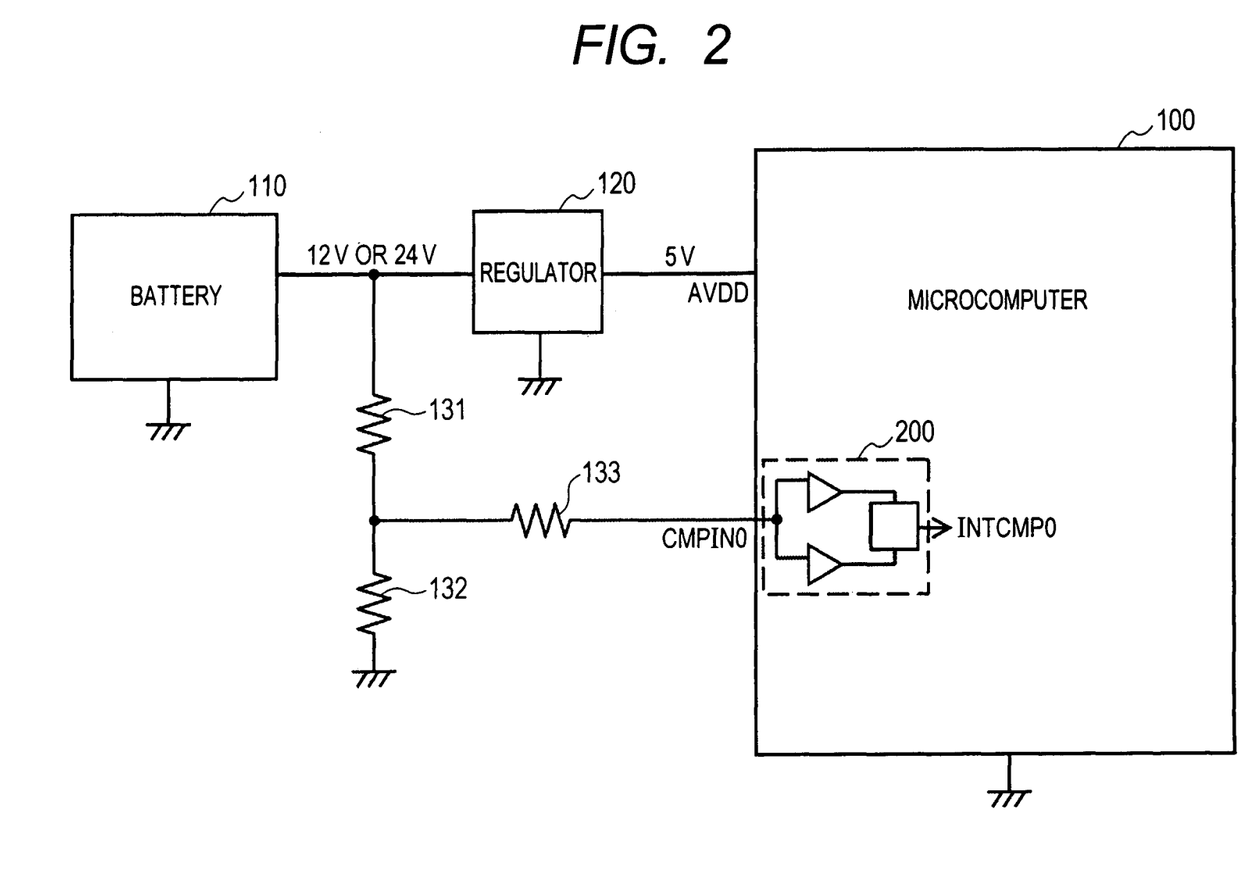
FIG. 2 is a general configuration diagram of the case of using a microcomputer according to the present invention for monitoring of power source voltage of a battery.

FIG. 2 is a configuration diagram of an entire system in the case of using the microcomputer 100 according to the present invention to monitor power source voltage of a battery. Although a battery 110 may be any battery, in this example, the battery 110 is the power source of a vehicle such as a car. The microcomputer 100 is used for a vehicle and it is assumed that the microcomputer 100 monitors a power source voltage of the battery 110. From the battery 110, the source voltage of 12 V or 24 V is outputted. A regulator 120 generates power source voltage of 5 V from the power source voltage of 12 V or 24 V supplied from the battery 110, and supplies the power to an AVDD terminal of the microcomputer 100. The power source voltage of 12 V or 24 V outputted from the battery 110 is divided by high-precision resistors 131 and 132 to a voltage of 5 V or less, and is coupled to a monitored voltage input terminal VCMPIN0 of the microcomputer 100 via a protection resistor 133. The microcomputer 100 monitors the voltage input from the VCMPIN0 terminal by the voltage monitoring unit 200 and performs a necessary control.

FIG. 3 is a circuit block diagram of the voltage monitoring unit 200 of the microcomputer 100 of the first exemplary embodiment. The voltage CMPIN0 to be monitored which is input from the monitored-voltage input terminal VCMPIN0 is coupled to comparators CH0 (201) and CH1 (202). To the comparators CH0 (201) and CH1 (202), the reference voltages VR0 and VR1 as voltages as references of voltage comparison with the voltage signal CMPIN0 to be monitored are coupled.

To the comparators CH0 (201) and CH1 (202), although the voltage signal CMPIN0 to be monitored is common, different voltages are supplied as the reference voltages VR0 and VR1 in order to compare the voltage signal CMPIN0 to be monitored with the different reference voltages by two comparators in parallel.

The reference voltage VR0 is generated by the trimming logic 0 (225), a resistor string 223, and the switch circuit 224 on the basis of a set value in the VR0 reference voltage setting register 227. The trimming logic 0 (225), the resistor string 223, and the switch circuit 224 function as a D/A converter CH0 for generating the analog voltage VR0 on the basis of the digital value set in the VR0 reference voltage setting register 227.

Similarly, the reference voltage VR1 is generated by the trimming logic 1 (226), the resistor string 223, and the switch circuit 224 on the basis of a set value in the VR1 reference voltage setting register 228. The trimming logic 1 (226), the resistor string 223, and the switch circuit 224 function as a D/A converter CH1 for generating the analog voltage VR1 on the basis of the digital value set in the VR1 reference voltage setting register 228. The resistor string 223 is commonly used by the D/A converters CH0 and CH1, and the switch circuit 224 includes a switch for CH0 and a switch for CH1. The trimming logic 0 (225) and the trimming logic 1 (226) are logic circuits for controlling the on/off state of the switch circuit 224 on the basis of the set values in the reference voltage setting registers 227 and 228, respectively.

A reference voltage generating circuit 211 is constructed by a band gap reference circuit that generates a voltage as a reference of D/A conversion. The reference voltage generating circuit 221 is not limited to the band gap reference circuit and may be another circuit as long as it can generate a stable constant voltage. The voltage generated by the reference voltage generating unit 221 is supplied as a reference voltage to a resistor string power supply circuit 222. To the resistor string power supply circuit 222, a feedback voltage VF as one of taps of the resistor string 223 is coupled. The resistor string power supply circuit 222 supplies power to one end of the resistor string 223 so that the value of the feedback voltage VF becomes equal to the voltage value outputted from the reference voltage generating circuit 221. The resistor string 223 is obtained by connecting a plurality of resistors in series and is coupled between the resistor string power supply circuit 222 and an analog ground line AGNDB. Each of the taps of the resistor string 223 is selected by the switch circuit 224, and voltages are supplied as reference voltages VR0 and VR1 to the comparators CH0 and CH1. A concrete configuration of the D/A converter is freely determined. Any configuration may be employed as long as an analog reference voltage is supplied to the comparators 201 and 202 on the basis of digital values set in the reference voltage setting registers 227 and 228.

CMPEN0 and CMPEN1 are signals for controlling whether the comparators 201 and 202 are operated or not. By an OR circuit 231 and a power switch 232, power is supplied to the resistor string 223 in the case any of the comparators 201 and 202 is used, and no power is supplied to the resistor string 223 when any of the comparators 201 and 202 is not used. By such an operation, a lower-power-consumption state is maintained. The power supply is interrupted by the power switches 233 and 234 when the comparators 201 and 202 are not used, thereby maintaining a lower-power-consumption state. In FIG. 3, the power switches 232 to 234 are constructed by NMOS transistors, and the on/off control of the power switch 232 is controlled by the OR circuit 231. In the case of constructing the power switches 232 to 234 by PMOS transistors, it is sufficient to invert the gate signals of the power switches 232 to 234.

The comparators 201 and 202 compare the voltage signal CMPIN0 to be monitored with the reference voltages VR0 and VR1, respectively. As a result, when the voltage signal CMPIN0 to be monitored is larger than the reference voltage, a high-level signal is outputted. When it is smaller than the reference voltage, a low-level signal is outputted.

To analog circuits including the D/A converter and the comparators 201 and 202 in the voltage monitoring unit 200, the power source voltage of 5 V is supplied. To logic circuits other than the analog circuits, the power source of 1.2 V is supplied. Consequently, to a voltage comparator 250 including the analog circuits, not only the power source AVDDC (5 V) but also the power source VDDC of 1.2 V for interface with digital circuits in the periphery of the voltage monitoring unit 200 are supplied. Output signals of the comparators 201 and 202 are level-shifted from the signal of 5 V to the signal of 1.2 V by level shifters 235 and 236 and output as a comparator CH0 output signal ICMPOUT0 and a comparator CH1 output signal ICMPOUT1 as a set signal and an inversion reset signal, respectively, to the set/reset flip-flop circuit 212 as a circuit of the voltage monitoring unit 200 on the outside of the voltage comparator 250.

The set/reset flip-flop circuit 212 is set when the signal ICMPOUT0 becomes the high level and is reset when the signal ICMPOUT1 becomes the low level. When the ICMPOUT0 is at the low level and the signal ICMPOUT1 is at the high level, the state is maintained. That is, the set/reset flip-flop circuit 212 is set when the comparator 201 determines that the voltage signal CMPIN0 to be monitored is larger than the reference voltage VR0, and is reset when the comparator 202 determines that the voltage signal CMPIN0 to be monitored is smaller than the reference voltage VR1. When the comparator 201 determines that the voltage signal CMPIN0 to be monitored is smaller than the reference voltage VR0 and when the comparator 202 determines that the voltage signal CMPIN0 to be monitored is larger than the reference voltage VR1, the state of the set/reset flip-flop circuit 212 is maintained.

Therefore, when the reference voltage VR0 is set to a voltage larger than the reference voltage VR1, the voltage signal CMPIN0 to be monitored can be converted to a digital signal of the same phase having a hysteresis characteristic using a high-level threshold voltage VR0 and a low-level threshold voltage VR1. The high-level threshold voltage VR0 and the low-level threshold voltage VR1 can be independently set to arbitrary values by setting of the reference voltage setting registers 227 and 228. The voltage signal CMPIN0 to be monitored is determined by using the different comparator circuits with the high-level threshold voltage VR0 and the low-level threshold voltage VR1. Consequently, within the operation voltage range of the comparators 201 and 202, the high-level threshold voltage VR0 and the low-level threshold voltage VR1 can be independently set to arbitrary voltage values. For example, even when one of the threshold voltages is changed, no influence is exerted on the other threshold voltage.

Further, the hysteresis comparator output signal CMPOUT0 as an output signal of the set/reset flip-flop circuit 212 is coupled to the interrupt control circuit 211. The interrupt control circuit 211 is a circuit for generating the interrupt signal INTCMP0 at an arbitrary edge of the hysteresis comparator output signal CMPOUT0. A CPU (not shown) of the microcomputer 100 may have an interrupt reception control circuit for processing the interrupt signal INTCMP0 as an interruption request signal and controlling whether the interrupt request is received or not. As a circuit on the CPU side of the microcomputer 100 that receives the interrupt signal INTCMP0, an interrupt receiving circuit of a known microcomputer can be used.

FIG. 10 is a circuit block diagram showing an example of the configuration of the interrupt control circuit 211. The hysteresis comparator output signal CMPOUT0 is delayed by a delay circuit 301 and the logic of the delayed signal is inverted by an inverter circuit 302. The resultant signal is coupled to an NOR circuit 303 and an AND circuit 304. To the other input terminal of each of the NOR circuit 303 and the AND circuit 304, the hysteresis comparator output signal CMPOUT0 is directly coupled. The NOR circuit 303 outputs a one-shot pulse at the trailing edge of the hysteresis comparator output signal CMPOUT0 and maintains the low level in the other time. On the other hand, the AND circuit 304 outputs a one-shot pulse at the trailing edge of the hysteresis comparator output signal CMPOUT0 and maintains the low level in other time.

An interrupt edge selecting register 306 is a register that controls whether or not the interrupt signal INTCMP0 is generated at the rising and trailing edges of the hysteresis comparator output signal CMPOUT0. When the logical value "1" is set in bit 0, the register 306 allows the interrupt signal INTCMP0 to be generated at the trailing edge of the signal CMPOUT0. When the bit 0 is reset to "0", the register 306 does not allow the interrupt signal INCMP0 to be generated at the trailing edge of the signal CMPOUT0. On the other hand, when "1" is set in the bit 1, the register 306 allows the interrupt signal INTCMP0 to be generated at the rising edge of CMPOUT0. When the bit 1 is reset to "0", the register 306 does not allow the interrupt signal INTCMP0 to be generated at the rising edge of the signal CMPOUT0. That is, by controlling the two bits, it can be arbitrarily controlled that no interrupt signal is generated at the edges of the hysteresis comparator output signal CMPOUT0, the interrupt signal INTCMP0 is generated at the trailing edge, the interrupt signal INTCMP0 is generated at the rising edge, or the interrupt signal INTCMP0 is generated at both of the rising and trailing edges. FIG. 10 shows an example of the circuit. The edge interruption can be controlled by an arbitrary circuit other than the circuit of FIG. 10.

Figure 4:
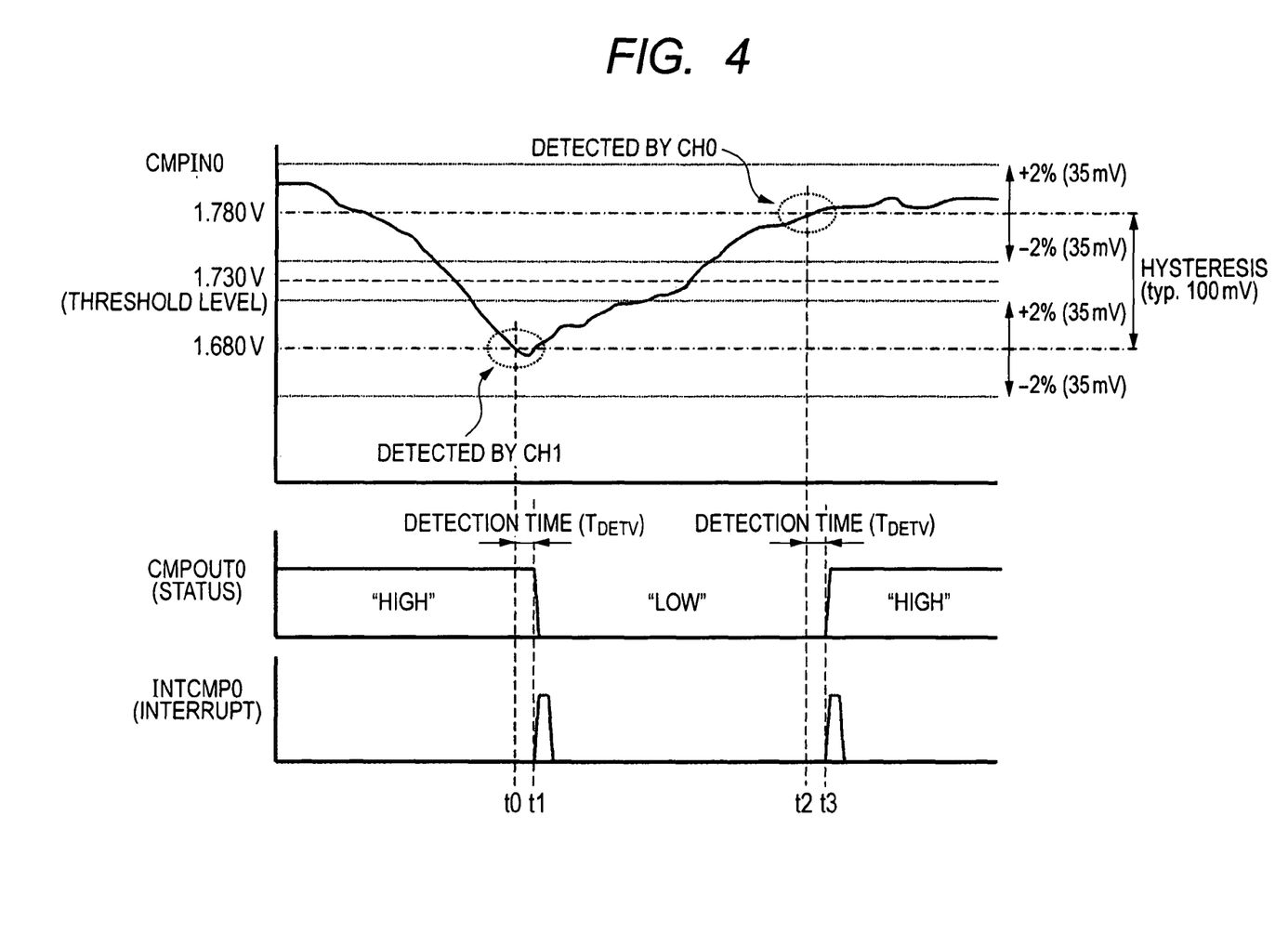
FIG. 4 is an operation waveform chart of the voltage monitoring unit in the first exemplary embodiment.

Next, the operation of the first exemplary embodiment will be further described with reference to FIG. 4 as an operation waveform chart of the voltage monitoring unit 200. In FIG. 4, a value is set in the VR0 reference voltage setting register 227 so that VR0 becomes 1.78 V, and a value is set in the VR1 reference voltage setting register 228 so that VR1 becomes 1.68 V. Further, when both of the comparator CH0 enable signal CMPEN0 and a comparator CH1 enable signal CMPEN1 are set to the high level, the operation of the comparators 201 and 202 is started. In an initial state, the voltage signal CMPIN0 to be monitored which is input from the monitored voltage input terminal VCMPIN0 is higher than VR0 (=1.78 V), so that the signal CMPOUT0 as an output signal of the set/reset flip-flop circuit 212 becomes high level. When the signal CMPIN0 becomes VR0 (=1.78 V) or less, an output of the comparator 201 is inverted, and the output signal becomes low level. A set signal to the set/reset flip-flop circuit 212 is cancelled, but the set/reset flip-flop circuit 212 maintains the set state.

When the voltage signal CMPIN0 to be monitored decreases to VR1=1.68 V at timing t0, the signal is delayed only by detection time TDETV) of the comparator 202. At timing t1, the set/reset flip-flop circuit 212 is reset, and the signal CMPOUT0 becomes the low level. Whether the interrupt signal INTCMP0 is outputted from the interrupt control circuit 211 or not depends on the setting of an interrupt edge selecting register 306 (refer to FIG. 10) provided on the inside of the interrupt control circuit 211. In FIG. 4, the interrupt edge selecting register 306 is set that the logical value "1" is set for two bits, and the interrupt signal is generated at both of the rising and trailing edges. Therefore, the interrupt signal INTCMP0 is outputted at timing t1. When the signal CMPIN0 becomes equal to or higher than VR1 (=1.68 V) after timing t0, an output of the comparator 201 is inserted and becomes high level. Although a reset signal to the set/reset flip-flop circuit 212 is cancelled, the set/reset flip-flop circuit 212 maintains the reset state.

When the voltage signal CMPIN0 to be monitored rises to VR0 (=1.78 V) or higher at timing t2, the set/reset flip-flop circuit 212 is set at timing t3 after lapse of the detection time (TDETV) of the comparator 201, and the signal CMPOUT0 becomes the high level. At this time, the interrupt signal INTCMP0 is outputted again.

In the first exemplary embodiment, any set/reset circuit may be used as the set/reset flip-flop circuit 212 as long as the set/reset circuit is set or reset when the voltage signal CMPIN0 to be monitored is higher than the higher one of the two reference voltages VR0 and VR1, is reset or set when the voltage signal CMPIN0 to be monitored is lower than the lower one of the voltages VR0 and VR1, and is not set/reset but maintains the state when the voltage signal CMPIN0 is an intermediate voltage between the higher and lower voltages. By setting or resetting the set/reset flip-flop circuit when the voltage CMPIN0 to be monitored is higher, the voltage signal CMPIN0 can be converted to the signal CMPOUT0 as a non-inversion signal or an inversion signal having a hysteresis characteristic.

In the first exemplary embodiment, the hysteresis circuit (the voltage comparator 250+the set/reset flip-flop circuit 212) in which the high-level threshold voltage and the low-level threshold voltage can be set independently of each other can be realized. Further, the two comparators 201 and 202 monitor the voltage CNPIN0 to be monitored in parallel. When a preset condition is satisfied, the interrupt signal is generated. Therefore, the microcomputer performing the interrupting process only when it is necessary can be realized.

Second Exemplary Embodiment

FIG. 5 is a circuit block diagram of a voltage monitoring unit 200A in the microcomputer 100A of a second exemplary embodiment. In FIG. 5, the same reference numerals are designated to the same components and operations as those of the microcomputer of the first exemplary embodiment shown in FIG. 3, and their description will not be repeated. In FIG. 5, the set/reset flip-flop circuit 212 in the first exemplary embodiment is not shown. ICMPOUT0 and ICMPOUT1 as output signals of the comparators 201 and 202 are directly coupled to the interrupt control circuit 211A.

The interrupt control circuit 211A of the second exemplary embodiment is provided with an interrupt control register of four bits shown in Table 1.

TABLE 1

| Interrupt control register | |
|---|---|
| I3 | When "0" is set, trailing edge of ICMPOUT1 is selected. When "1" is set, rising edge of ICMPOUT1 is selected. |
| I2 | When "0" is set, trailing edge of ICMPOUT0 is selected. When "1" is set, rising edge of ICMPOUT0 is selected. |
| I1 | When "0" is set, INTCMP0 is not output at edges of ICMPOUT1 . When "1" is set, INTCMP0 is outputted at edges of ICMPOUT1. |
| I0 | When "0" is set, INTCMP0 is not output at edges of ICMPOUT0. When "1" is set, INTCMP0 is outputted at edges of ICMPOUT0. |

As shown in Table 1, in the bits I0 and I1 of the interrupt control register, whether the interrupt signal INTCMP0 is outputted or not at the edges of ICMPOUT0 and ICMPOUT1 is set. By the bits I2 and I3 of the interrupt control register, whether or not the interrupt signal is outputted when CMPIN0 becomes the reference voltages VR0 and VR1 or less and whether or not the interrupt signal is outputted when CMPIN0 becomes the reference voltages VR0 and VR1 or higher. An interrupt request according to a comparison result of the comparator 201 is controlled by the bits I0 and I2 of the interrupt control register, and an interrupt request according to a comparison result of the comparator 202 is controlled by the bits I1 and I3 of the interrupt control register.

As registers for setting the reference voltages VR0 and VR1, in addition to the VR0 reference voltage setting register 227 and the VR1 reference voltage setting register 228, the VR0 spare voltage setting register 242 and the VR1 spare voltage setting register 243 are provided. Any of the VR0 reference voltage setting register 227, the VR1 reference voltage setting register 228, the VR0 spare voltage setting register 242, and the VR1 spare voltage setting register 243 may have a configuration that a signal can be read/written from/to a not-shown CPU of the microcomputer 100A. The VR0 reference voltage setting register 227 and the VR0 spare voltage setting register 242 may be regarded as a VR0 reference voltage setting register group, and the VR1 reference voltage setting register 228 and the VR1 spare voltage setting register 243 may be regarded as a VR0 reference voltage setting register group.

The VR0 spare voltage setting register 242 and the VR1 spare voltage setting register 243 function as follows. In the case where a condition of outputting the interrupt signal INTCMP0 is satisfied by the signal ICMPOUT0, after outputting the signal INTCMP0, the set value in the VR0 reference voltage setting register 227 is updated with the set value in the VR0 spare voltage setting register 242. In the case where a condition of outputting the interrupt signal INTCMP0 is satisfied by the signal ICMPOUT1, after outputting the signal INTCMP0, the set value in the VR1 reference voltage setting register 228 is updated with the set value in the VR1 spare voltage setting register 243. With such a configuration, when the condition of requesting an interruption is satisfied, the interrupt signal is outputted and the reference voltage as a reference of the interrupt request can be automatically changed by the set value in the spare voltage setting register.

Next, the operation of the case of monitoring a decrease in the power source voltage supplied to the system by using the function of the second exemplary embodiment will be described by using the operation waveform chart of the voltage monitoring unit 200A of FIG. 6. In FIG. 6, "0011" (I3=I2=0, I1=I0=1) are set in the bits of the interrupt control registers I3 to I0. When both of the comparators 201 and 202 detect that the power source voltage becomes equal to or less than the reference voltage, the interrupt signal INTCMP0 is outputted. A voltage DetLVt1 is set in the reference voltage setting register 227 in the comparator 201 (CH1), and a voltage DetLVt3 is set in the spare voltage setting register 242. A voltage DetLVt2 is set in the reference voltage setting register 228 in the comparator 202 (CH1). In the operation of FIG. 6, the spare voltage setting register 243 in the comparator 202 (CH1) is not used.

When the voltage of CMPIN0 is higher than the voltage DetLVt1, the microcomputer 100A performs normal operation. When the voltage of CMPIN0 is equal to or less than the voltage DetLVt1 and is equal to or higher than the voltage DetLVt2, the microcomputer 100A switches to the low-power-consumption mode. Further, when the voltage of CMPIN0 is equal to or less than the voltage DetLVt2 and is equal to or higher than the voltage DetLVt3, the microcomputer 100A backs up data. When the voltage of CMPIN0 is equal to or less than the voltage DetLVt3, the system is stopped.

When the decrease in the power source voltage is gentle like in FIG. 6, by sequentially switching the reference voltage to a lower voltage by a single comparator, the operation mode of the microcomputer 100A can be switched. However, the power source voltage can drop sharply for some reason. In the second exemplary embodiment, in the initial state, the comparator 201 (CH0) monitors that the voltage drops to the voltage DetVt1 or less and, concurrently in parallel, the comparator 202 (CH1) can monitor a sharp drop in the voltage to the voltage DetVt2 or less. Further, when the comparator 201 (CH0) detects that the voltage CMPIN0 is equal to or less than the voltage DetVt1, automatically, the reference voltage of the comparator 201 (CH0) is switched to the voltage DetVt3.

Therefore, even when the voltage CMPIN0 sharply drops from the voltage DetVt1 or higher to the voltage DetVt3 or less, if time of automatically switching the reference voltage of the comparator 201 (CH0) is assured, no problem occurs. Also during the period in which the reference voltage of the comparator 201 (CH0) is switched, the voltage CMPIN0 can be monitored by the comparator 202 (CH1). Further, when the condition of outputting the interrupt signal IMTCMP0 is satisfied once, the reference voltage is automatically switched. Even when the comparator does not have the hysteresis characteristic, a problem in a conventional microcomputer such that interruption occurs a plurality of times due to noise around the threshold voltage described in FIG. 1 can be also solved.

In the second exemplary embodiment, in the case where an interrupt vector address in the interrupt with the signal ICMPOUT0 and that in the interrupt with the signal ICMPOUT1 are different from each other, the interrupt control circuit 211 may be provided with a function of giving priority to one of interrupt requests when an interrupt request by the signal ICMPOUT0 and an interrupt request by the signal ICMPOUT1 are made simultaneously. For example, in the case where the voltage CMPIN0 sharply drops from the voltage DetVt1 or higher to the voltage DetVt2 or less, although both of the interrupt request by the ICMPOUT0 signal and the interrupt request by the ICMPOUT1 signal are satisfied, priority can be given to a process addressing the sharp drop in the voltage by the signal ICMPOUT1.

As a variation of the second exemplary embodiment, when one of the interrupt condition by the signal ICMPOUT0 signal and the interrupt condition by the ICMPOUT1 signal is satisfied, the signal INTCMP0 is not output. Only when both of the conditions are satisfied, the signal INTCMP0 may be output. By providing such a function, the interrupt signal INTCMP0 can be output only when the voltage CMPIN0 becomes the intermediate voltage of the upper-limit voltage and the lower-limit voltage. To realize such a circuit, it is sufficient to provide an AND circuit of an interrupt request signal based on the signal ICMPOUT0 and an interrupt request signal based on the signal ICMPOUT1 and use an output signal of the AND circuit as the signal ICMPOUT0.

Third Exemplary Embodiment

Figure 7:
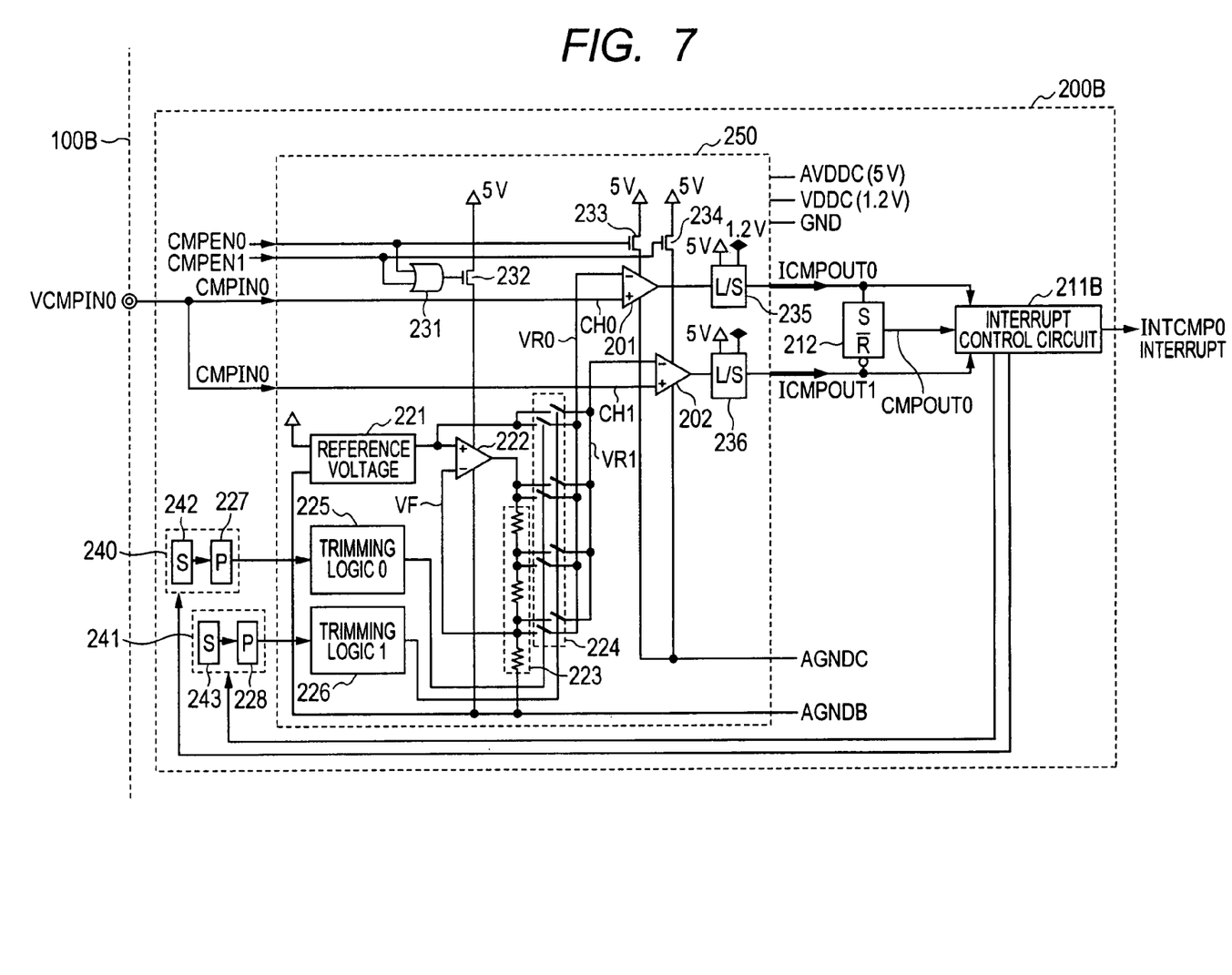
FIG. 7 is a circuit block diagram of a voltage monitoring unit in a microcomputer in a third exemplary embodiment.

FIG. 7 is a circuit block diagram of a voltage monitoring unit 200B in the microcomputer 100B including both the comparator circuits having the hysteresis characteristic of the first exemplary embodiment and the function of automatically switching the reference voltage of the second exemplary embodiment. A third exemplary embodiment is different from the first and second exemplary embodiments with respect to the point that both of the signal CMPOUT0 from the set/reset flip-flop circuit 212 and the signals ICMPOUT0 and ICMPOUT1 directly from the comparators 201 and 202 are input to the interrupt control circuit 211B. Interruption by the signal CMPOUT0 can be controlled by the interrupt edge selecting register described with reference to FIG. 10, and interruption by the signals ICMPOUT0 and ICMPOUT1 can be controlled by the interrupt control register described in the second exemplary embodiment.

Fourth Exemplary Embodiment

FIG. 8 is a circuit block diagram of a voltage monitoring unit 200C in the microcomputer 100C of a fourth exemplary embodiment. In the fourth exemplary embodiment, the output signal CMPOUT0 of the set/reset flip-flop circuit 212 can be outputted from an output buffer circuit 400 to the outside of the microcomputer 100C. The microcomputer 100C of the fourth exemplary embodiment is obtained by providing the microcomputer 100B of the third exemplary embodiment with a function of converting a signal input from the input terminal VCMPIN0 to a digital signal having a hysteresis and outputting the digital signal from the output terminal OUT. The hysteresis characteristic of the high-level threshold voltage and the low-level threshold voltage can be freely set.

Fifth Exemplary Embodiment

FIG. 9 is a circuit block diagram of a voltage monitoring unit 200D in the microcomputer 100D of a fifth exemplary embodiment. In FIG. 9, the microcomputer 100B of the third exemplary embodiment is provided with a counter for counting the output signal CMPOUT0 of the set-reset flip-flop circuit 212, and an output signal of the counter is coupled to the interrupt control circuit 211D. For example, when a signal obtained by dividing the voltage of an alternating-current source to the monitored-voltage input terminal VCMPIN0, the frequency of the alternating-current source can be also counted. Although it is difficult to remove noise from a signal of the alternating-current source, in the fifth exemplary embodiment, the high-level threshold voltage and the low-level threshold voltage having the hysteresis characteristic can be freely set. Consequently, noise can be removed and only a desired signal can be counted. When the count value reaches a predetermined value, the interrupt signal INTCMP0 can be output. As the counter 410, a counter which can be provided in a one-chip microcomputer can be used.

Although the invention has been described above in connection with several exemplary embodiments thereof, it will be appreciated by those skilled in the art that those exemplary embodiments are provided solely for illustrating the invention, and should not be relied upon to construe the appended claims in a limiting sense.

Further, it is noted that, notwithstanding any claim amendments made hereafter, applicant's intent is to encompass equivalents all claim elements, even if amended later during prosecution.

What is claimed is:

1. A microcomputer comprising:
a first comparator which compares a voltage to be monitored, with a first reference voltage;
a second comparator which compares the voltage to be compared, with a second reference voltage;
an interrupt control circuit which monitors the voltage to be monitored by the first and second comparators in parallel and, when a preset condition is satisfied, generates an interrupt signal;
a first D/A converter which sets the first reference voltage; and
a second D/A converter which sets the second reference voltage.

2. The microcomputer according to claim 1, further comprising:
a flip-flop circuit which is set according to a comparison result of one of the first and second comparators and is reset according to a comparison result of the other comparator,
wherein a first mode of generating the interrupt signal at an edge of an output signal of the flip-flop circuit is provided.

3. The microcomputer according to claim 2,
wherein it can be set to inhibit interruption in the first mode or set a condition of generating the interrupt signal at a rising edge and/or a trailing edge can be set.

4. The microcomputer according to claim 1,
wherein a second mode of generating the interrupt signal is provided when either a first interrupt generating condition according to a comparison result of the first comparator or a second interrupt generating condition according to a comparison result of the second comparator is satisfied.

5. A microcomputer comprising:
a first comparator which compares a voltage to be monitored, with a first reference voltage;
a second comparator which compares the voltage to be compared, with a second reference voltage;
an interrupt control circuit which monitors the voltage to be monitored by the first and second comparators in parallel and, when a preset condition is satisfied, generates an interrupt signal,
wherein a second mode of generating the interrupt signal is provided when either a first interrupt generating condition according to a comparison result of the first comparator or a second interrupt generating condition according to a comparison result of the second comparator is satisfied; and
a register capable of setting whether interruption by the first and second comparators in the second mode is inhibited or not or whether the interrupt signal is generated in the case where a comparison result of the first and second comparators is large or small.

6. The microcomputer according to claim 4, further comprising:
a first reference voltage setting register which sets the first reference voltage;
a second reference voltage setting register which sets the second reference voltage; and
a spare voltage setting register which is provided in correspondence with at least one of the first and second comparators,
wherein, when the comparator generates the interrupt signal in the second mode, the spare voltage setting register updates a value of a reference voltage setting register of the comparator with a value of the spare voltage setting register.

7. The microcomputer according to claim 2,
wherein an output signal of the flip-flop circuit can be set in an external terminal.

8. The microcomputer according to claim 2, further comprising:
a counter circuit which counts an output signal of the flip-flop circuit,
wherein, when a counter value of the counter circuit reaches a predetermined value, the interrupt signal is generated.

9. The microcomputer according to claim 1,
wherein a third mode of generating no interrupt signal is provided when either a first interrupt generating condition according to a comparison result of the first comparator or a second interrupt generating condition according to a comparison result of the second comparator is satisfied and generating the interrupt signal when the first and second interrupt generating conditions are satisfied simultaneously.

10. The microcomputer according to claim 4,
wherein in the second mode, in the case where the first and second interrupt generating conditions are satisfied simultaneously,
priority is placed on an interruption generated when one of the interrupt generating conditions is satisfied over an interruption generated when the other interrupt generating condition is satisfied.

11. The microcomputer according to claim 1, further comprising:
an input terminal of the voltage to be monitored.

12. A hysteresis comparator circuit comprising:
- a first comparator which compares a voltage to be monitored with a first reference voltage;
- a second comparator which compares the voltage to be compared, with a second reference voltage;
- a first D/A converter which sets the first reference voltage;
- a second D/A converter which sets the second reference voltage; and
- a flip-flop circuit which is set according to a comparison result of one of the first and second comparators and is reset according to a comparison result of the other comparator.

\* \* \* \* \*